United States Patent
Choi et al.

[11] Patent Number: 5,998,829
[45] Date of Patent: *Dec. 7, 1999

[54] NON-VOLATILE MEMORY DEVICE INCORPORATING A DUAL CHANNEL STRUCTURE

[75] Inventors: Woong-Lim Choi; Kyeong-Man Ra, both of Cheongju-si, Rep. of Korea

[73] Assignee: LG Semicon Co., Ltd., Chungcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/985,679

[22] Filed: Dec. 5, 1997

[30] Foreign Application Priority Data

Apr. 2, 1997 [KR] Rep. of Korea ............ 97/12209

[51] Int. Cl.$^6$ .................. H01L 29/788; H01L 29/792
[52] U.S. Cl. ................. 257/315; 257/326; 438/263
[58] Field of Search .................. 257/314, 315, 257/326; 438/263

[56] References Cited

U.S. PATENT DOCUMENTS

| | | | |
|---|---|---|---|
| 5,047,362 | 9/1991 | Bergemont | 437/52 |
| 5,633,518 | 5/1997 | Broze | 257/314 |
| 5,648,289 | 7/1997 | Park | 438/278 |
| 5,793,673 | 8/1998 | Pio et al. | 365/185.01 |

OTHER PUBLICATIONS

Kume et al., "A 1.28 $\mu m^2$ Contactless Memory Cell Technology for a 3V–Only 64Mbit EEPROM" IEDM Technical Digest, International Electron Devices Meeting 1992, pp. 24.7.1–24.7.3.

*Primary Examiner*—Olik Chaudhuri
*Assistant Examiner*—Howard Weiss
*Attorney, Agent, or Firm*—Morgan, Lewis & Bockius LLP

[57] ABSTRACT

A non-volatile memory device and a method of fabricating the same are disclosed. The non-volatile memory device includes a semiconductor substrate having a first conductive type, a plurality of first, second and third impurity regions having a second conductive type in the substrate, a plurality of first insulating layer only on the substrate between the second and third impurity regions, a second insulating layer on the substrate except on the first insulating layer formed, a plurality of floating gate on the first and second insulating layers, a plurality of dielectric layer on the floating gate, a plurality of control gate on the dielectric layer.

24 Claims, 9 Drawing Sheets

NON-VOLATILE MEMORY DEVICE INCORPORATING A DUAL CHANNEL STRUCTURE

This application claims the benefit of Korean Application No. 12209/1997 filed on Apr. 2, 1997, which is hereby incorporated by reference.

BACKGROUND OF THE INVENTION

1. Field of the Invention

The present invention relates to a semiconductor device, and more particularly, to a non-volatile memory device and a method of fabricating the same. Although the present invention is suitable for a wide scope of applications, it is particularly suitable for increasing a coupling ratio of the device and simplifying the process for fabrication.

2. Discussion of the Related Art

FIG. 1 illustrates a schematic view of a conventional non-volatile memory device having a simple stack structure. The conventional non-volatile memory device includes a p-type semiconductor substrate 1, a tunneling oxide layer 2 on the substrate 1, and a floating gate 3 on the tunneling oxide layer 2. A control gate 5 is over the floating gate 3 and a dielectric layer 4 is between the floating gate 3 and the control gate 5. N-type impurity regions 6 are formed in the p-type semiconductor substrate 1 at both sides of the floating gate 3.

However, the conventional non-volatile memory device having the simple stack type has a disadvantage in a coupling constant of the control gate 5. As a cell size becomes small, the coupling constant also becomes small. To solve this problem, an ONO (Oxide/Nitride/Oxide) structure has been used as the dielectric layer 4 between the floating gate 3 and the control gate 5. Nonetheless, this is not a desirable solution for the problem because the process becomes complicated and annealing should be executed at a high temperature.

Moreover, at least one metal contact has to be formed for every two cells in constructing a cell array of the conventional non-volatile memory device as shown in FIG. 1. Thus, an effective cell size becomes larger. Accordingly, much effort for development and research has been directed to non-volatile memory devices to eliminate metal contacts in solving the problem.

FIG. 2 is a layout of the conventional non-volatile memory device not having a metal contact. FIG. 3 is a cross-sectional view showing a structure of the non-volatile memory device taken along line III—III of FIG. 2.

In the conventional non-volatile memory device not having a metal contact, additional metal lines for bit lines are not required. Instead, source and drain regions are used as the bit lines. In other words, a plurality of pairs of n-type heavily doped impurity regions 12 are formed in parallel in a semiconductor substrate 11 and separated from each other by a predetermined distance. Word lines (control gates) 13, separated from each another by a predetermined distance, are also formed on the semiconductor substrate 11 and perpendicular to the impurity regions 12. Floating gates 14 are formed on the word lines 13 and the impurity regions 12. A dielectric layer 16 (shown in only FIG. 3) is formed between the word lines 13 and the floating gates 14. A tunneling insulating layer 17, for example, oxide, is formed between the floating gates 14 and the semiconductor substrate 11. Source and drain regions of the impurity regions 12 used as bit lines are isolated from each other by an isolating layer 15.

In the conventional non-volatile memory device not having a metal contact, a bit line is not required for each cell, but only one metal contact for every 16 cells is needed because of resistance of impurity regions. Thus, the effective cell size is reduced.

Nevertheless, since the non-volatile memory device not having a metal contact has the simple stack structure, it still has the problem of low coupling. As an effort to solve the low coupling of the conventional non-volatile memory device shown in FIGS. 2 and 3, another conventional non-volatile memory having a different structure has been suggested.

FIG. 4 is a layout of another conventional non-volatile memory device to improve the low coupling of the conventional non-volatile memory device shown FIGS. 3 and 4. FIG. 5 is a cross-sectional view showing a structure of the non-volatile memory device, taken along line V—V of FIG. 4.

Heavily doped n-type impurity regions 22a, 22b, and 22c are formed in parallel in a semiconductor substrate 21. An oxide layer as a tunneling insulating layer 27 is formed on the entire surface of the semiconductor substrate 21. A plurality of first floating gates 24a and 24b having a matrix form are formed on portions of the tunneling insulating layer 27 between the impurity regions 22a, 22b, and 22c. An insulating layer 28 is formed on the tunneling insulating layer 27 between the first floating gates 24a and 24b. A plurality of second floating gates 24c are formed on the pairs of the first floating gates 24a and 24b. Word lines (control gates) 23 are formed on the semiconductor substrate 21 including the first and second floating gates 24a, 24b, and 24c and perpendicular to the impurity regions 22a, 22b, and 22c. The word line 23 also covers the first and second floating gates 24a, 24b, and 24c. A dielectric layer 26 (shown in only FIG. 5) is formed between the word line 23 and the second floating gate 24c. In this structure, the two adjacent first floating gates are connected with the second floating gate 14c, thereby increasing the coupling ratio.

Therefore, the impurity region 22b under the second floating gate 24c is used as a common drain region, and the impurity regions 22a and 22c at both sides of the second floating gate 24c are used as source regions. In addition, all impurity regions 22a, 22b, and 22c are used as bit lines.

However, the conventional non-volatile memory device for improving the low coupling ratio has the following problems yet to be solved. Although two first floating gates are connected with a second floating gate to increase the coupling ratio, each cell contacts the second floating gate with the first floating gates formed on two channel regions having an identical tunneling insulating layer, and thus increase in the coupling ratio is limited. Furthermore, since first floating gates are formed on the channel regions between the impurity regions, and the two adjacent first floating gates are connected with the second floating gate and a word line is formed thereon, the process to fabricate this type of device is still complicated so that reliability of the device is greatly reduced.

SUMMARY OF THE INVENTION

Accordingly, the present invention is directed to a non-volatile memory device and a method of fabricating the same that substantially obviates one or more of the problems due to limitations and disadvantages of the related art.

An object of the invention is to provide a non-volatile memory device and a method of fabricating the same to improve its coupling ratio and simplify the fabrication process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a non-volatile memory device comprises a semiconductor substrate having a first conductive type; a plurality of first, second, and third impurity regions having a second conductive type in the substrate; a plurality of first insulating layers only on the substrate between the second and third impurity regions; a second insulating layer on the substrate except on the first insulating layer formed; a plurality of floating gates on the first and second insulating layers; a plurality of dielectric layers on the floating gates; a plurality of control gates on the dielectric layers.

In another aspect of the invention, a non-volatile memory device having a monitor transistor and program/read transistor comprises a semiconductor substrate having a first conductive type; a plurality of first and second impurity regions having a second conductive type in parallel each other in the semiconductor substrate; a plurality of tunneling insulating layers having a square shape on the semiconductor substrate between the first and second impurity regions; an insulating layer on the semiconductor substrate excluding the portion on which the tunneling insulating layers are formed; a plurality of floating gates on the tunneling insulating layers and the insulating layer; a dielectric layer on the floating gates; and a plurality of word lines on the floating gates perpendicular to the first and second impurity regions.

In another aspect of the invention, a method of fabricating a device having a first conductive semiconductor substrate comprises the steps of forming a plurality of first, second, and third impurity regions having a second conductive type in the substrate; depositing an insulating layer on an entire surface of the substrate; etching the insulating layer to form a plurality of square shapes between the first and second impurity regions; forming a plurality of tunneling insulating layers on the square shapes in the insulating layer; forming a plurality of floating gates on the tunneling insulating layers on the insulating layer between the first and second impurity regions and between the second and the third impurity regions; forming a dielectric layer on the floating gates; and forming control gates on the floating gates perpendicular to the impurity regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 7:
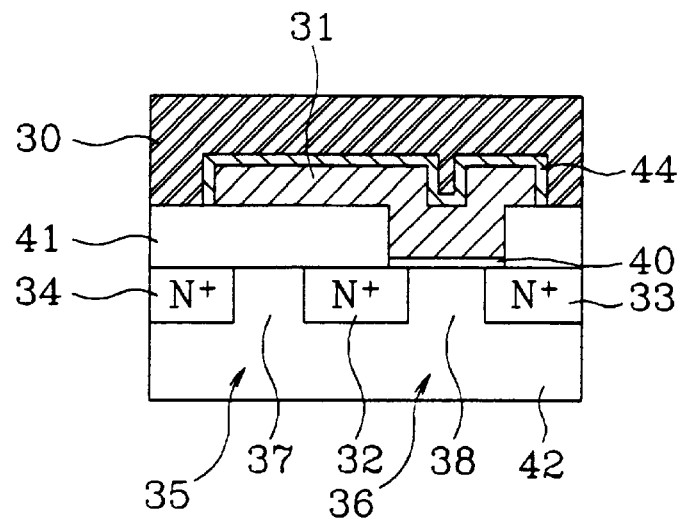
FIG. 7 is a cross-sectional view of a unit cell of a non-volatile memory device according to the present invention.

A non-volatile memory cell of the present invention is designed to have two channels. Referring to FIG. 7, a floating gate 31 is formed below a control gate 30, and there are first and second channels 37 and 38 corresponding to one floating gate 31. A common source terminal 32 is formed between the first and second channels 37 and 38. A monitor drain terminal 34 and a program/read drain terminal 33 are formed at both sides of the two channels 37 and 38.

Accordingly, a monitor transistor 35 is composed of the floating gate 31, the monitor drain terminal 34, and the common source terminal 32. A program/read transistor 36 is composed of the floating gate 31, the program/read drain terminal 33, and the common source terminal 32. The program/read transistor 36 carries out programming and reading as main functions of the memory device, while the monitor transistor 35 carries out a verifying operation simultaneously in programming.

According to the present invention, the monitor transistor 35 and the program/read transistor 36 have different threshold voltages measured at the floating gate 31. Details will be described with reference to FIG. 7 as follows.

Since a non-volatile memory cell has two channels, three n-type impurity regions, such as a common source terminal 32, a program/read drain terminal 33, and a monitor drain terminal 34, are formed below the surface of a semiconductor substrate 42. They are spaced apart from one another by a predetermined distance. A tunneling insulating layer 40 is formed over the second channel 38 between the impurity regions adjacent to the program/read transistor 36, while an insulating layer 41 is formed over the first channel 37 between the impurity regions adjacent to the monitor transistor 35. As shown in FIG. 7, the insulating layer 41 is much thicker than the tunneling insulating layer 40. A floating gate 31 is formed between the first and second channel regions 37 and 38 and a dielectric layer 44 is formed on the floating gate 31.

Ion implantations for forming the first and second channel regions 37 and 38 are performed to differentiate threshold voltages. In addition, the insulating layer 41 is formed to be much thicker than the tunneling insulating layer 40 in order to increase the coupling ratio. Thus, the monitor transistor 35 and the program/read transistor 36 have different threshold voltages due to a thickness difference.

Figure 1:
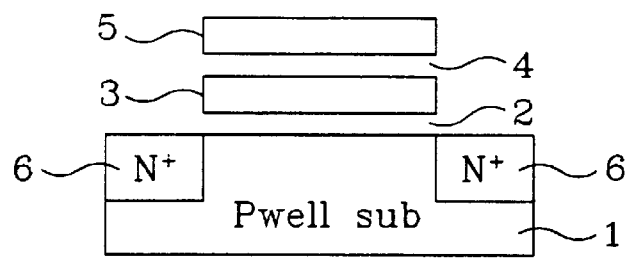
FIG. 1 is a cross-sectional view showing a structure of a conventional non-volatile memory device.
Figure 2:
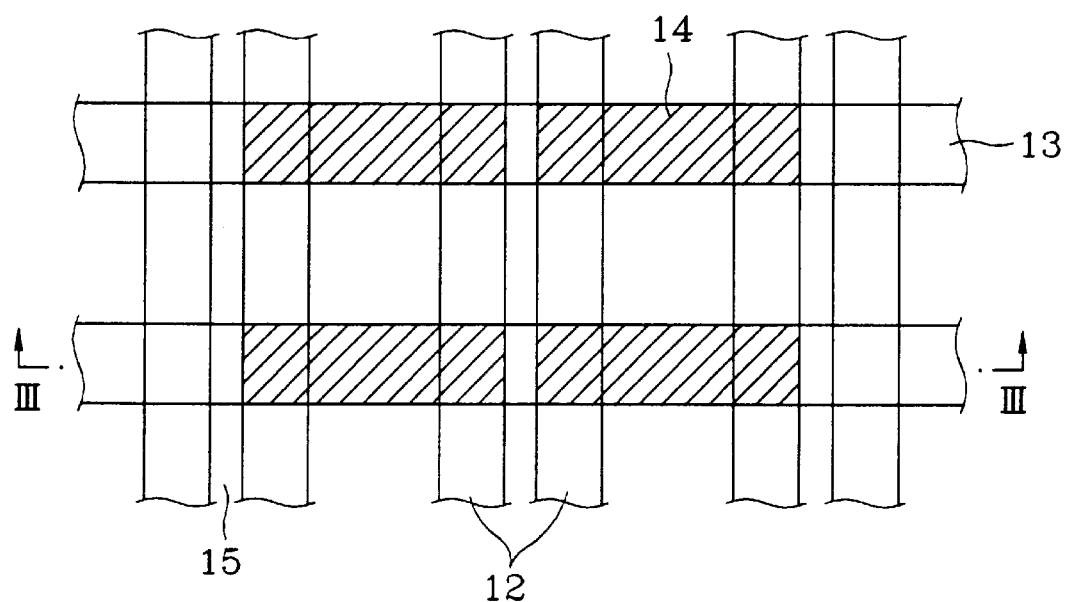
FIG. 2 is a layout of the conventional non-volatile memory device no having a metal contact.
Figure 3:
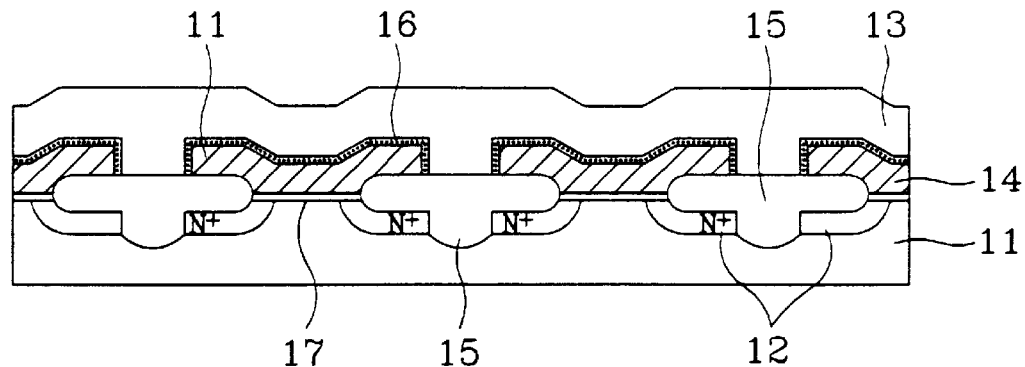
FIG. 3 is a cross-sectional view showing a structure of the conventional non-volatile memory device not having the metal contact, taken along line III—III of FIG. 2.
Figure 4:
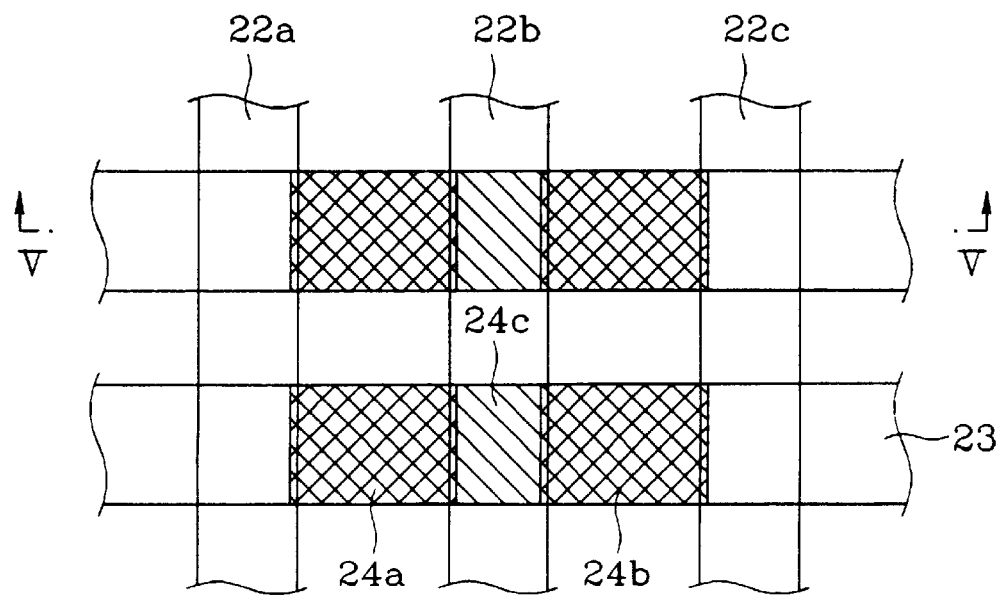
FIG. 4 is a layout of another conventional non-volatile memory device to improve low coupling problem.
Figure 5:
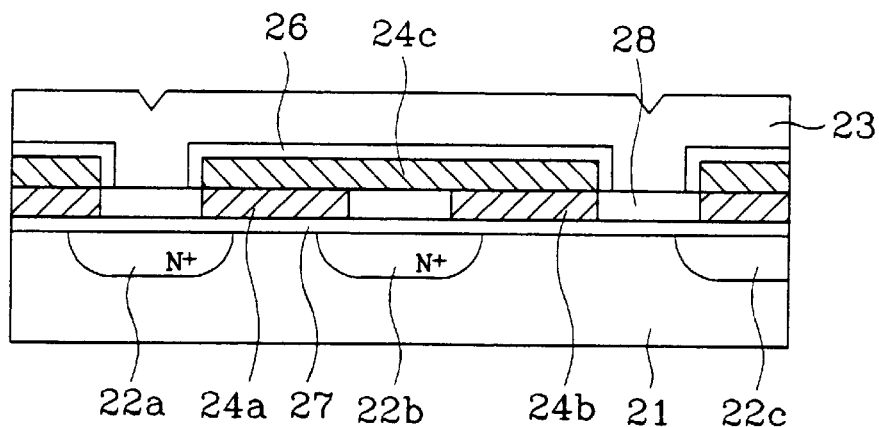
FIG. 5 is a cross-sectional view showing the conventional non-volatile memory device, taken along line V—V of FIG. 4.
Figure 6:
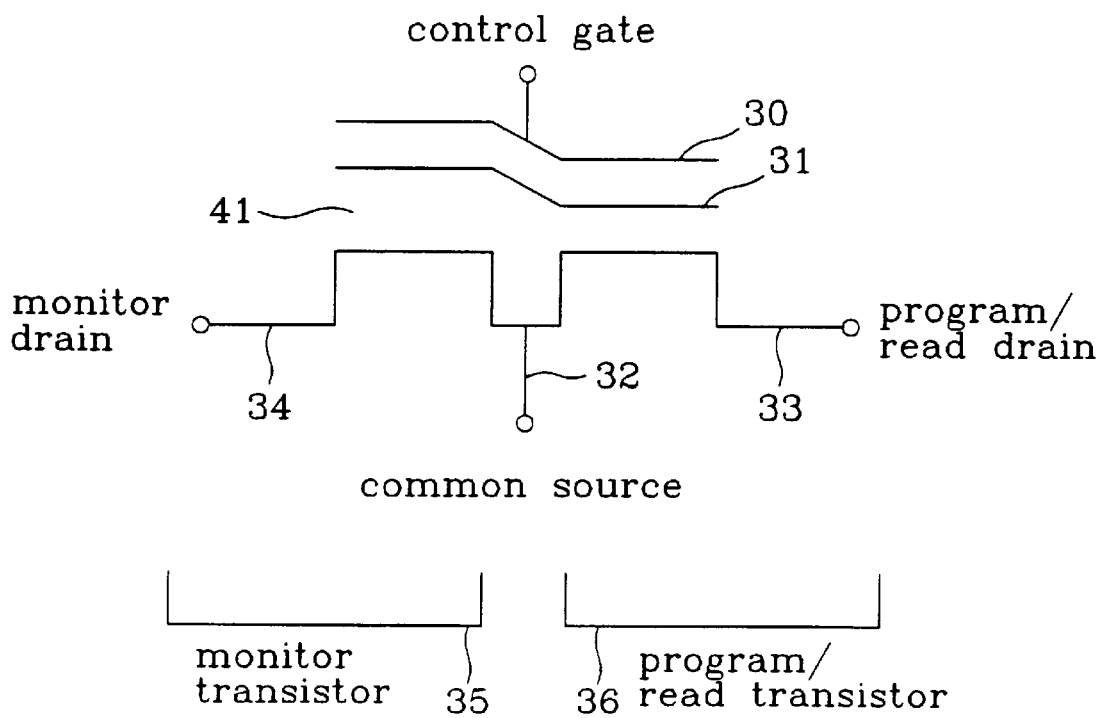
FIG. 6 is a circuit diagram of a unit cell of a non-volatile memory device according to the present invention.
Figure 8:
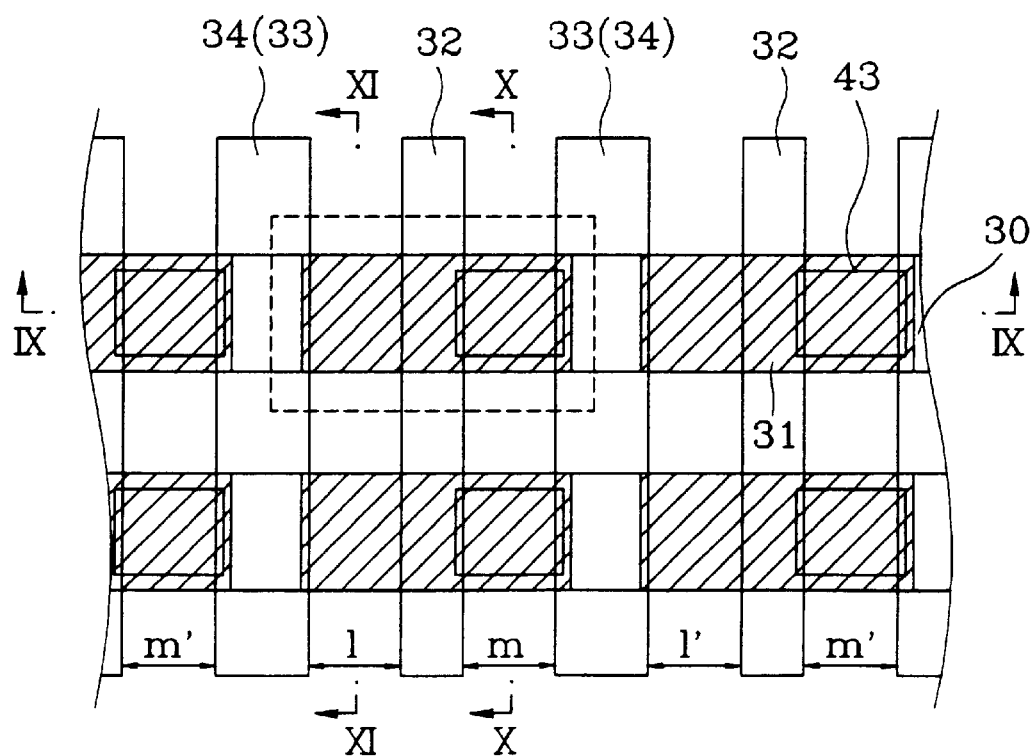
FIG. 8 is a layout of a non-volatile memory device according to the present invention.

FIG. 8 is a layout of the non-volatile memory device of the present invention. As shown in FIG. 8, a plurality of n-type impurity regions are formed in parallel and separated from one another by a predetermined distance. The impurity regions are a common source terminal 32, a program/read drain terminal 33, and a monitor drain terminal 34, as described in FIGS. 6 and 7. Distances between the impurity regions 32 and 33 adjacent to the program/read transistor 36 should be identical (that is, m=m'=m''= . . . ). Distances between the impurity regions 32 and 34 adjacent to the monitor transistor 35 should be also be identical (that is, l=l'=l''= . . . ). A width of the common source terminal 32 is narrower than that of the monitor drain terminal 33 and the program/read drain terminal 34.

A plurality of word lines (control gates 30), separated from one another in parallel by a predetermined distance, are formed perpendicular to the impurity regions. The floating gate 31 is formed below the word lines 30 and overlaps with the first and second channel regions 37 and 38 formed between an impurity region and another impurity region. The tunneling insulating layer 40 is formed on the second channel region 38 between the floating gate 31 and the semiconductor substrate 40.

Figure 9:
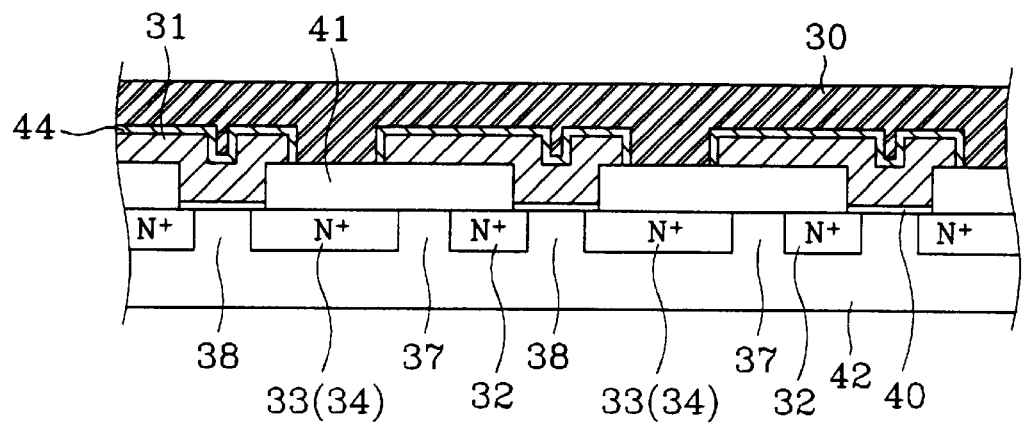
FIG. 9 is a cross-sectional view showing a structure of the non-volatile memory device according to the present invention, taken along line IX—IX of FIG. 8.

FIG. 9 is a cross-section taken along the line IX—IX of FIG. 8 in the direction of the word lines 30. Common source terminals 32 and program/read and monitor drain terminals 33 and 34 (all n-type impurity regions) are formed below the surface of the semiconductor substrate 42 separated by a predetermined distance. The tunneling insulating layer 40 is formed on the semiconductor substrate 42 between the common source terminal 32 and the program/read drain terminal 33. An insulating layer 41, such as a high temperature and low pressure dielectric (HLD) layer thicker than the tunneling insulating layer 40, is formed on the semiconductor substrate 42 where the tunneling insulating layer 40 has not been formed. The floating gate 31 is formed, on the tunneling insulating layer 40 and the insulating layers 41. The dielectric layer 44 is formed on the surface of the floating gate 31, and the word line (control gate) 30 is formed over the dielectric layer 44.

Figure 10:
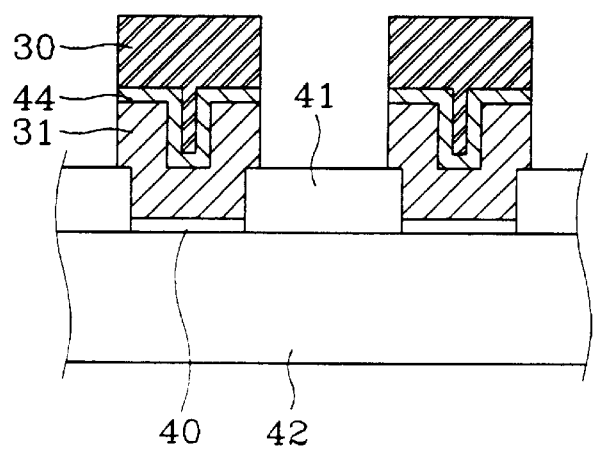
FIG. 10 is a cross-sectional view showing a structure of the non-volatile memory device according to the present invention, taken along line X—X of FIG. 8.

FIG. 10 illustrates a structure of the program/read transistor 36 of the non-volatile memory device taken along the line X—X of FIG. 8. The tunneling insulating layers 40 are formed on predetermined portions of a p-type semiconductor substrate 42 and isolated from each other. The insulating layers 41 are formed the p-type semiconductor substrate 42 where the tunneling insulating layers 40 have not been formed. The floating gate 31, the dielectric layer 44, and the word line (control line) 30 are successively formed on the tunneling insulating layer 40.

Figure 11:
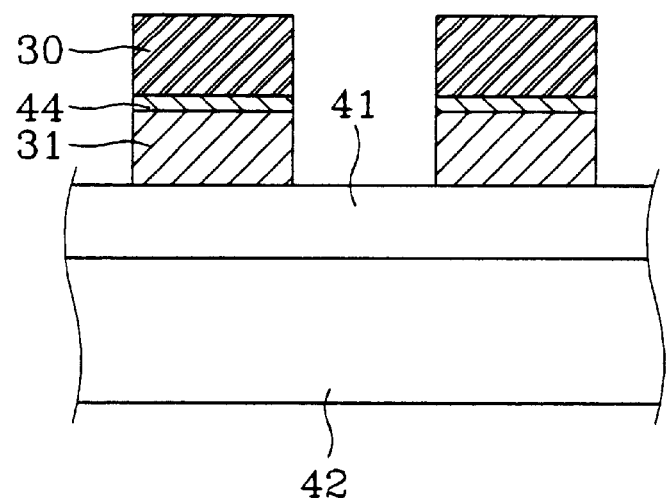
FIG. 11 is a cross-sectional view showing a structure of the non-volatile memory device according to the present invention, taken along line XI—XI of FIG. 8.

FIG. 11 illustrates a structure of the monitor transistor of the non-volatile memory device taken along the line XI—XI of FIG. 8. The insulating layer 41 is formed on the p-type semiconductor substrate 42. Subsequently, the floating gate 31, the dielectric layer 44, and the word line (control line) 30 are successively formed thereon.

A method of fabricating the aforementioned non-volatile memory device will now be described with reference to FIGS. 12A to 12G.

Figure 12A:
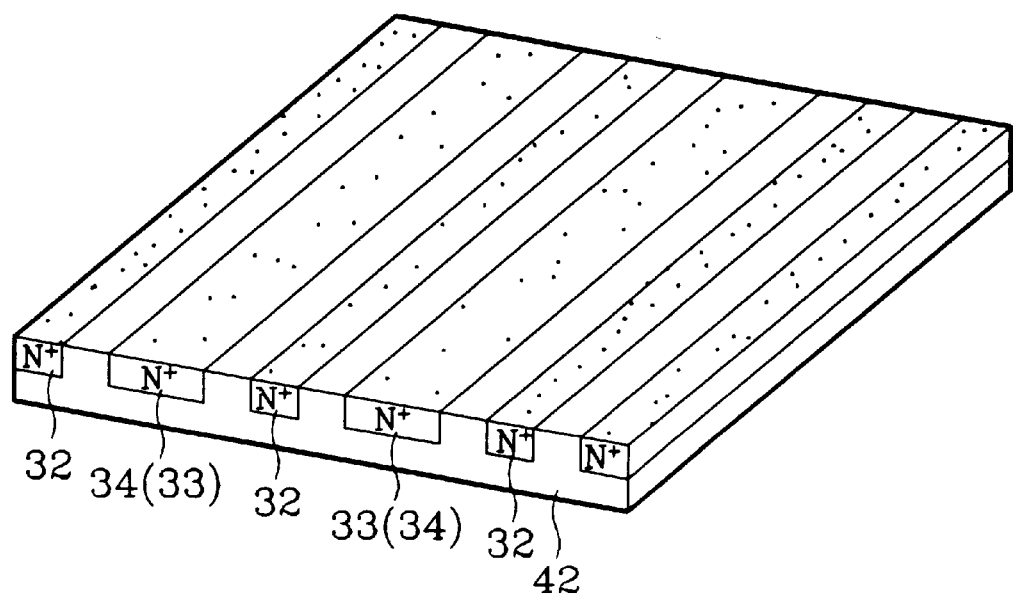
FIGS. 12A and 12G are perspective views showing process steps of fabricating a non-volatile memory device according to a preferred embodiment of the present invention.

Referring initially to FIG. 12A, a photoresist film (not shown) is coated on the p-type semiconductor substrate 42 and patterned by an exposure and development process to define common source terminals, program/read drain terminals, and monitor drain terminals. N-type impurity ions are heavily implanted into the exposed p-type semiconductor substrate 42 so as to form common source terminals 32, program/read drain terminals 33, and monitor drain terminals 34. At this time, the program/read drain terminal 33 is at the right side of the common source terminal 32 and the monitor drain terminal 34 is at left side of the common source terminal 32.

Figure 12B:
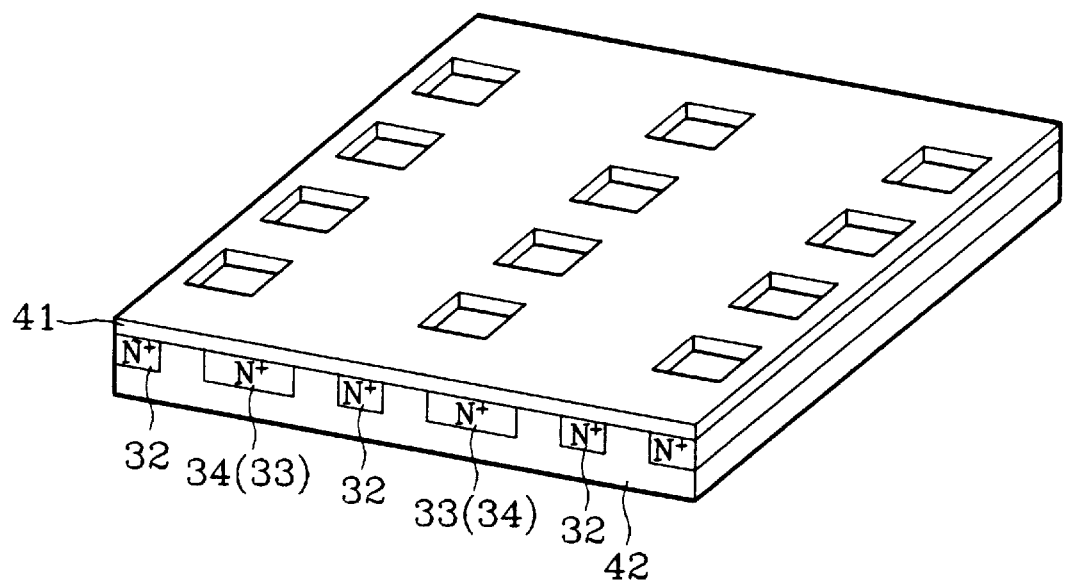

Referring to the FIG. 12B, the insulating layer 41 such as a HLD layer for isolating unit cells is formed on the entire surface of the semiconductor substrate 42 and then etched to form a square shape over the channel regions of a program/read transistor of each cell between the common source terminals 32 and the program/read drain terminal 33.

Figure 12C:
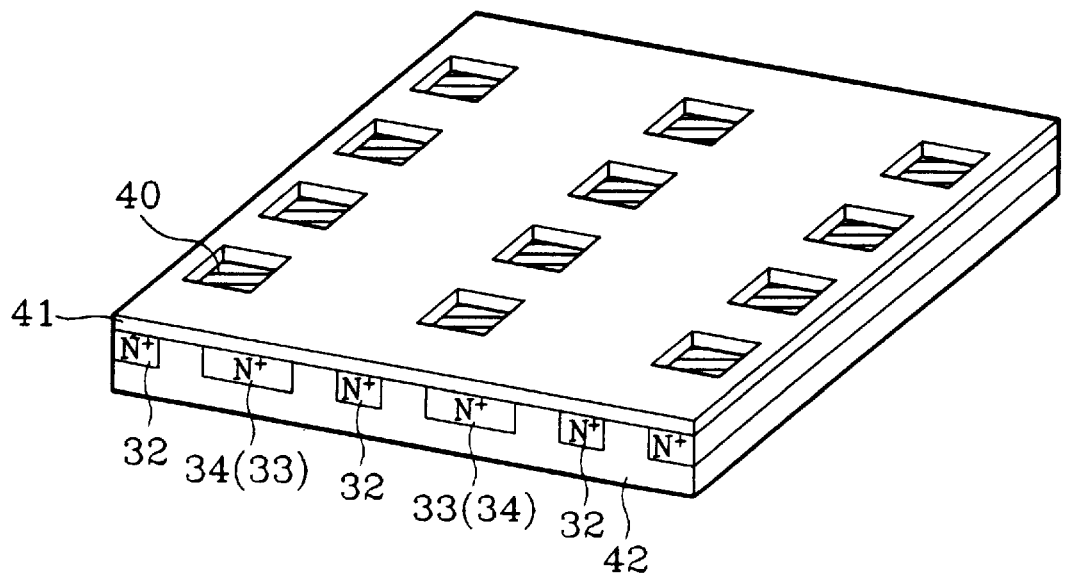

Referring to the FIG. 12C, the tunneling insulating layers 40 are deposited on the etched portions of the square shape. In this process, oxide layers as the tunneling insulating layers 40 are deposited by a thermal oxidation process or chemical vapor deposition (CVD) process.

Figure 12D:
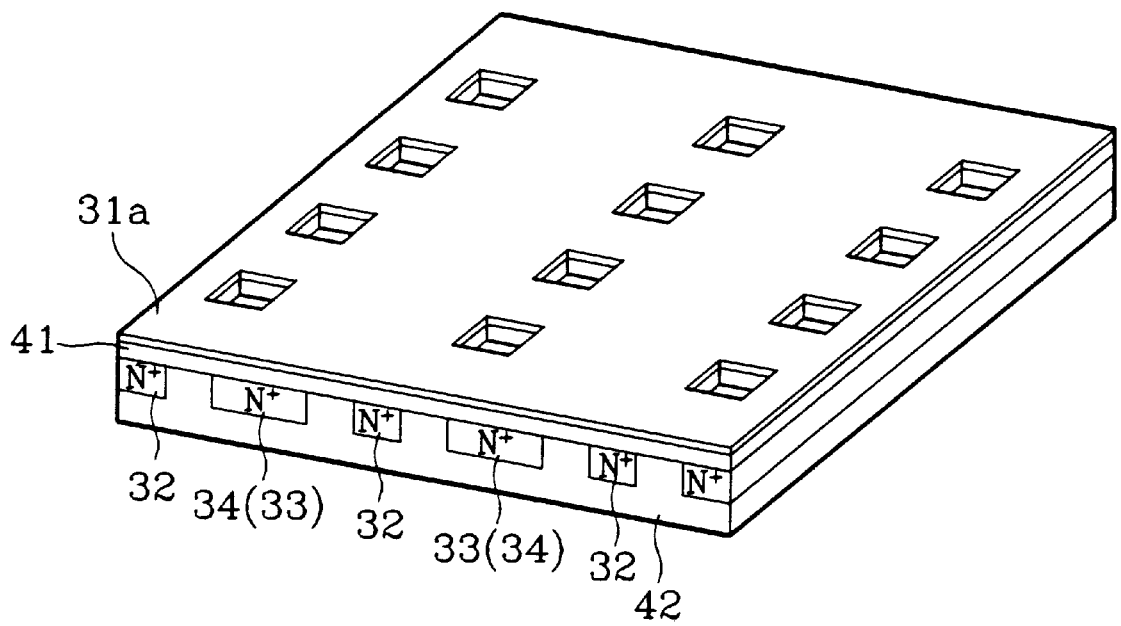

Referring to FIG. 12D, a first polysiliconl layer 31a is deposited on the entire surface including the insulating layer 41 and the tunneling insulating layers 40. In this process, the first polysilicon layer 31a is formed to have a very thin thickness in filling the etched portions of the square shape in order to increase the coupling ratio.

Figure 12E:
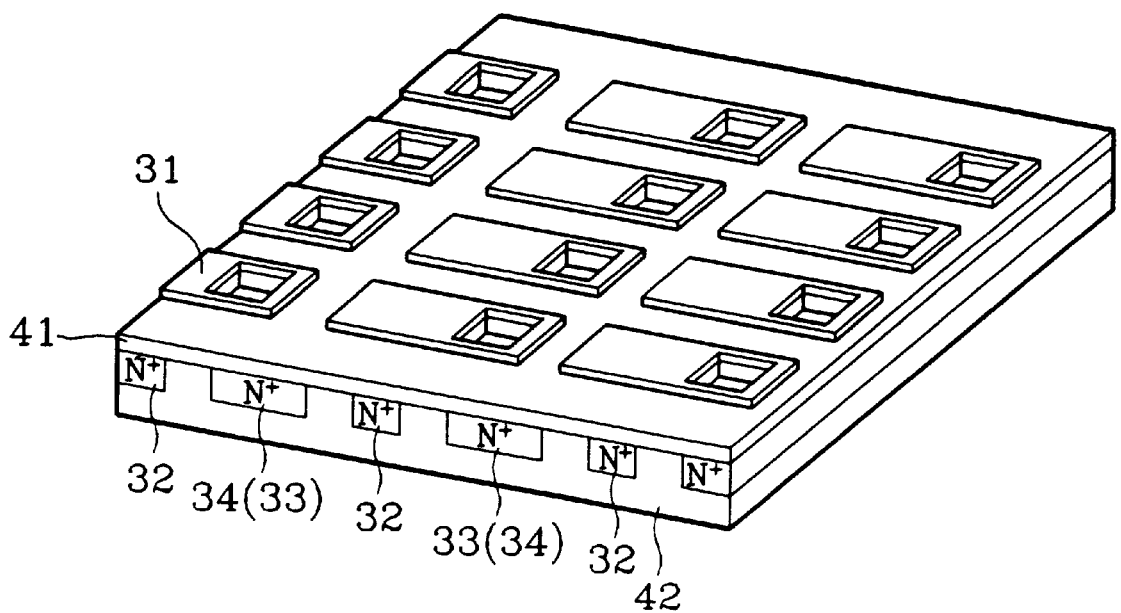

Referring to FIG. 12E, the first polysilicon layer 31a is selectively removed to form the floating gates 31 on the insulating layer 41 and the tunneling insulating layers 40 (not shown) between the common source terminal 32 and the program/read drain terminal 33 and between the common source terminal 32 and the monitor drain terminal 34.

Figure 12F:
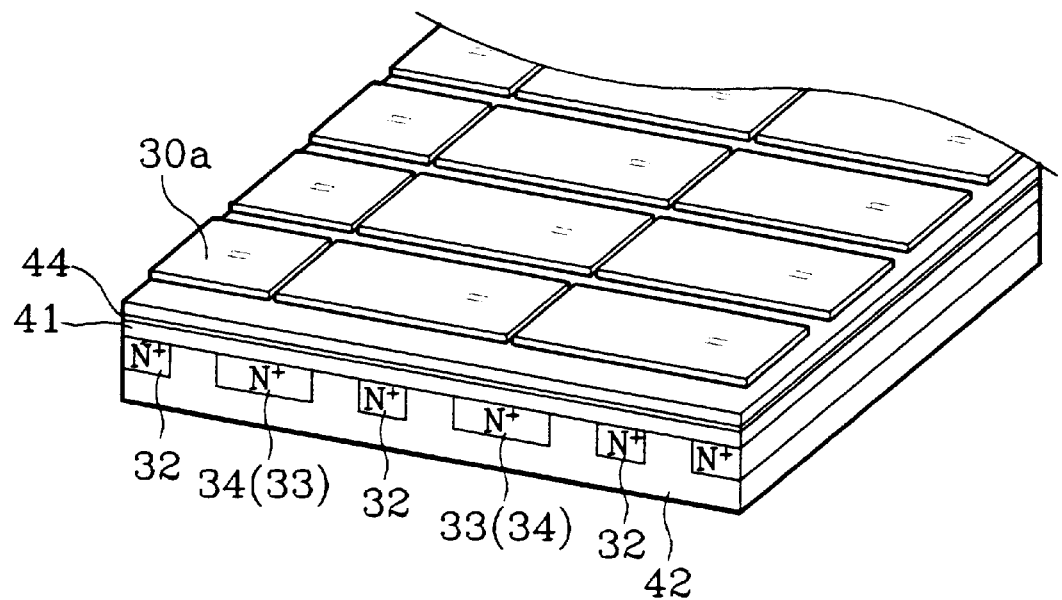

Referring to FIG. 12F, the dielectric layer 44 such as ONO or oxide is deposited on the entire surface including the floating gates 31 and then a second polysilicon layer 30a is deposited on the dielectric layer 44.

Figure 12G:
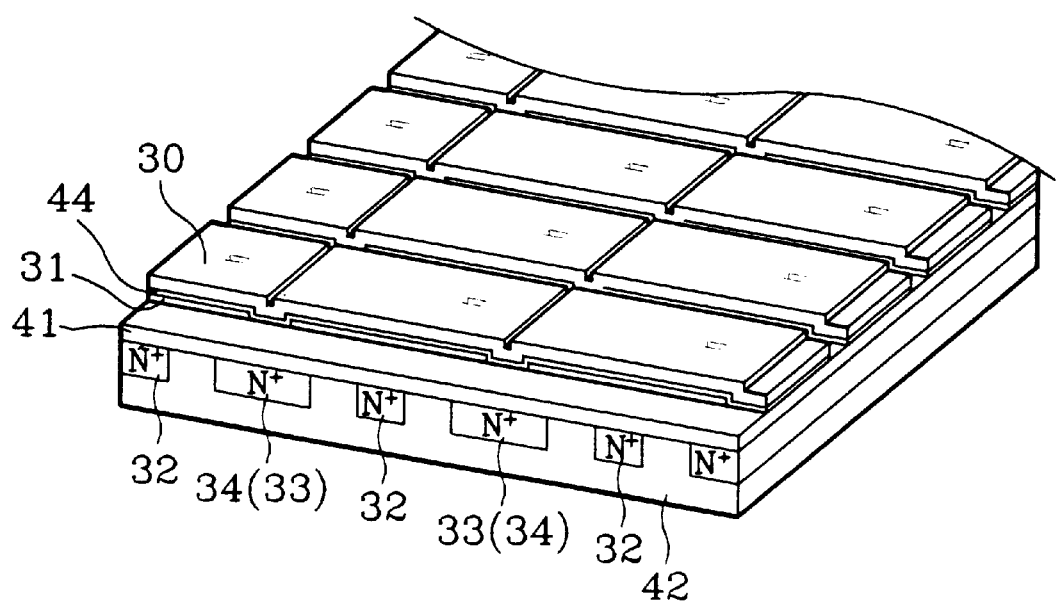

Referring to FIG. 12G, the second polysilicon layer 30a is selectively removed to form word lines (control gate) 30 perpendicular to the common source terminals 32, the program/read drain terminals 33, and the monitor drain terminals 34 and on the floating gates 31.

The non-volatile memory device and the method of fabricating the same have the following advantages. Since a coupling constant is high, it is easily applicable to high-speed and low-resistance devices. In addition, the memory array is constructed without a metal contact. Thus, a cell size is decreased and the process is significantly simplified by forming the tunneling insulating layer on the square shape of the insulating layer. Moreover, since a unit cell is composed of a program/read transistor and a monitor transistor, a charge state in the floating of floating gates of the cell is monitored simultaneously in programming.

It will be apparent to those skilled in the art that various modification and variations can be made in the non-volatile memory device and the method of fabricating the same of the present invention without departing from the spirit or scope of the inventions. Thus, it is intended that the present invention cover the modifications and variations of this invention provided they come within the scope of the appended claims and their equivalents.

What is claimed is:

1. A non-volatile memory device comprising:

a semiconductor substrate having a first conductive type;

a plurality of first, second, and third impurity regions having a second conductive type in the substrate;

a plurality of first insulating layers only on the substrate between the second and third impurity regions;

a second insulating layer on the substrate except between the second and third impurity regions;

a plurality of floating gates on the first and second insulating layers;

a plurality of dielectric layers on the floating gates, wherein the floating gates directly contact each of the first and second insulating layers and the dielectric layers;

a plurality of control gates on the dielectric layers.

2. The non-volatile memory device according to claim 1, further comprising first and second channel regions between the first and second impurity regions and the second and third impurity regions, respectively.

3. The non-volatile memory device according to claim 1, wherein the first, second, and third impurity regions include a common source terminal, a program/read drain terminal, and a monitor drain terminal, respectively.

4. The non-volatile memory device according to claim 1, wherein the first insulating layers include tunneling insulating layers.

5. The non-volatile memory device according to claim 1, wherein the second insulating layer has a thickness substantially greater than the first insulating layers.

6. The non-volatile memory device according to claim 1, wherein the second impurity regions have a width greater than the first and third impurity regions.

7. The non-volatile memory device according to claim 1, wherein the dielectric layers include oxide/nitride/oxide or oxide.

8. The non-volatile memory device according to claim 1, wherein the second insulating layer includes a high temperature and low pressure dielectric (HLD) layer.

9. The non-volatile memory device according to claim 1, wherein each of the first and second impurity regions are separated from each other by the same distance.

10. The non-volatile memory device according to claim 1, wherein each second and third impurity regions are separated from each other by the same distance.

11. The non-volatile memory device according to claim 1, wherein each of the first insulating layers has an indentation.

12. A non-volatile memory device having a monitor transistor and program/read transistor, comprising:

a semiconductor substrate having a first conductive type;

a plurality of first and second impurity regions having a second conductive type in parallel each other in the semiconductor substrate;

a plurality of tunneling insulating layers having a square shape on the semiconductor substrate between the first and second impurity regions;

an insulating layer on the semiconductor substrate excluding the portion between the first and second impurity regions;

a plurality of floating gates on the tunneling insulating layers and the insulating layer;

a dielectric layer on the floating gates, wherein the floating gates directly contact each of the dielectric layer, the insulating layer, and the tunneling insulating layers; and a plurality of word lines on the floating gates perpendicular to the first and second impurity regions.

13. The non-volatile memory device according to claim 12, wherein each first and second impurity regions are separated from each other by the same distance.

14. The non-volatile memory device according to claim 12, wherein each of the second impurity regions has a width greater than each of the first impurity regions.

15. The non-volatile memory device according to claim 12, wherein each of the first impurity regions is a common source terminal and each of the second impurity regions is one of a program/read drain terminal or a monitor drain terminal.

16. The non-volatile memory device according to claim 12, wherein the insulating layer has a thickness greater than the tunneling insulating layers.

17. The non-volatile memory device according to claim 12, wherein the monitor transistor and the program/read transistor have different threshold voltages.

18. The non-volatile memory device according to claim 12, wherein the monitor transistor and the program/read transistor are connected in series with each other.

19. The non-volatile memory device according to claim 1, wherein the first insulating layers directly contact the second insulating layers.

20. The non-volatile memory device according to claim 1, further comprising;

a first channel between the first and second impurity regions, the first channel being covered only with the second insulating layers; and a second channel between the second and third impurity regions, the second channel being covered only with the first insulating layers.

21. The non-volatile memory device according to claim 1, wherein the first insulating layers have portions overlapped the second and third impurity regions.

22. The non-volatile memory device according to claim 12, wherein the tunneling insulating layers directly contact the insulating layer.

23. The non-volatile memory device according to claim 12, further comprising;

a channel between the first and second impurity regions, the channel being covered only with the first insulating layers.

24. The non-volatile memory device according to claim 12, wherein the tunneling insulating layers have portions overlapped the first and second impurity regions.

* * * * *